(12) United States Patent
Maida et al.

(10) Patent No.: US 7,935,648 B2
(45) Date of Patent: May 3, 2011

(54) TITANIA-DOPED QUARTZ GLASS FOR NANOIMPRINT MOLDS

(75) Inventors: Shigeru Maida, Joetsu (JP); Hisatoshi Otsuka, Joetsu (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 292 days.

(21) Appl. No.: 12/133,007

(22) Filed: Jun. 4, 2008

(65) Prior Publication Data

US 2008/0305941 A1 Dec. 11, 2008

(30) Foreign Application Priority Data

Jun. 6, 2007 (JP) ................. 2007-150534

(51) Int. Cl.
*C03C 3/06* (2006.01)
*C03C 3/076* (2006.01)
(52) U.S. Cl. .......................... 501/54; 501/55
(58) Field of Classification Search ............. 501/53, 501/54, 55, 56
See application file for complete search history.

(56) References Cited

U.S. PATENT DOCUMENTS

| | | | |
|---|---|---|---|
| 7,294,595 B2 * | 11/2007 | Iwahashi et al. | 501/54 |
| 7,485,593 B2 * | 2/2009 | Ezaki et al. | 501/54 |
| 2003/0226375 A1 | 12/2003 | Bernas et al. | |
| 2005/0245383 A1 * | 11/2005 | Iwahashi et al. | 501/54 |
| 2006/0276323 A1 * | 12/2006 | Iwahashi et al. | 501/54 |
| 2007/0042893 A1 * | 2/2007 | Koike et al. | 501/54 |

FOREIGN PATENT DOCUMENTS

| | | |
|---|---|---|
| JP | 2000-86259 A | 3/2000 |
| JP | 2001-311801 A | 11/2001 |
| JP | 2003-192363 A | 7/2003 |
| JP | 2006-210404 A | 8/2006 |
| JP | 2006-306674 A | 11/2006 |
| WO | 01/08163 A1 | 2/2001 |
| WO | 02/32622 A1 | 4/2002 |
| WO | 03/076352 A2 | 9/2003 |
| WO | 03/077038 A2 | 9/2003 |
| WO | WO-2006/004169 A1 * | 1/2006 |
| WO | 2006/080241 A2 | 8/2006 |

OTHER PUBLICATIONS

European Search Report dated Nov. 4, 2008, issued in corresponding European Patent Application No. 08251961.2.
Database WPI Week 200701; Thompson Scientific, London, GB; AN 2007-004333; XP002501238 & JP 2006 306674 A (Shinetsu Sekiei KK) Nov. 9, 2006 abstract.
Japanese Office Action dated Nov. 19, 2009, issued in corresponding Japanese Patent Application No. 2007-150534.
Anand Agarwal et al. "A simple IR spectroscopic method for determining fictive temperature of silica glasses", Journal of Non-Crystalline Solids, 185 (1995) 191-198.

* cited by examiner

*Primary Examiner* — Jerry Lorengo
*Assistant Examiner* — Noah S Wiese
(74) *Attorney, Agent, or Firm* — Westerman, Hattori, Daniels & Adrian, LLP

(57) ABSTRACT

In the nanoimprint lithography, a titania-doped quartz glass having a CTE of −300 to 300 ppb/° C. between 0° C. and 250° C. and a CTE distribution of up to 100 ppb/° C. at 25° C. is suited for use as nanoimprint molds.

8 Claims, 2 Drawing Sheets

TITANIA-DOPED QUARTZ GLASS FOR NANOIMPRINT MOLDS

CROSS-REFERENCE TO RELATED APPLICATION

This non-provisional application claims priority under 35 U.S.C. §119(a) on Patent Application No. 2007-150534 filed in Japan on Jun. 6, 2007, the entire contents of which are hereby incorporated by reference.

TECHNICAL FIELD

This invention relates to a titania-doped quartz glass for use as nanoimprint molds, having a low coefficient of thermal expansion.

BACKGROUND ART

As is well known, the semiconductor technology has made remarkable advances toward higher integration of integrated circuits. This tendency promoted to use a light source of shorter wavelength in the lithography process for semiconductor device manufacture. Photolithography using ArF excimer laser (193 nm) is the current main stream. A transition to photolithography using extreme ultraviolet (EUV) is expected to enable further integration. As the technology for the fabrication of semiconductor devices with a half-pitch of 32 nm or less, not only the photolithography, but also the nanoimprint lithography are considered promising.

The nanoimprint lithography is expected to find a wide variety of applications including optical waveguides, biochips, and optical storage media.

The nanoimprint lithography involves furnishing a mold (also referred to as stamp or template) having a fine pattern predefined thereon by electron beam lithography and etching techniques, coating a resin material on a substrate, and forcing the mold against the resin film for transferring the configuration of the fine pattern to the resin film. Specifically, semiconductor devices are fabricated by forcing a mold against a resist film coated on the surface of semiconductor wafer such as silicon for transferring the fine pattern.

The nanoimprint lithography is generally divided into photo nanoimprint lithography and thermal nanoimprint lithography. The photo nanoimprint lithography uses a photocurable resin as the resin material. While the mold is pressed against the resin, ultraviolet (UV) radiation is irradiated to the resin for curing, thereby transferring a fine pattern.

On the other hand, the thermal nanoimprint lithography uses a thermoplastic resin as the resin material. A fine pattern is transferred by pressing the mold against the thermoplastic resin which has been softened by heating above the glass transition temperature. Alternatively, a fine pattern is transferred by pressing the mold against a thermosetting resin while heating up to the curing temperature.

The properties required for nanoimprint molds include a mechanical strength to prevent failure of the mold during fine pattern transfer and a chemical stability to be inert to the resin.

The thermal nanoimprint lithography has to apply heat for the purpose of softening thermoplastic resins or curing thermosetting resins. The mold used therein experiences a temperature change from room temperature to about 200° C., depending on the type of resin used. If the mold is made of a material having thermal expansion, any deformation of the mold can bring about a decline of location accuracy. Then the mold used in the thermal nanoimprint lithography is desirably made of a material having minimal thermal expansion over the wide temperature range from room temperature to about 200° C.

In the photo nanoimprint lithography, the mold does not experience a temperature change as occurring in the thermal nanoimprint lithography. Then only thermal expansion around room temperature is of concern. However, since the photo nanoimprint lithography is expected applicable to the fabrication of semiconductor devices with a fine feature size of 32 nm or less, a more strict location accuracy is needed. Also to enable single large-area transfer which is one of the advantages of the photo nanoimprint lithography, the mold must be made of a material having a uniform thermal expansion as well as low thermal expansion around room temperature.

JP-A 2006-306674 discloses the use of a low thermal expansion material as the mold material in the photo nanoimprint lithography. The more precise transfer of a fine pattern, however, requires to control the distribution of a coefficient of linear thermal expansion within the mold. Also the thermal nanoimprint lithography requires a mold material having low thermal expansion over a wider temperature range.

DISCLOSURE OF THE INVENTION

An object of the invention is to provide a titania-doped quartz glass for use as molds in the nanoimprint lithography, which undergoes a minimized deformation upon temperature changes during the fine size pattern transfer.

The inventors have found that a titania-doped quartz glass having a coefficient of linear thermal expansion (CTE) in the range of −300 to 300 ppb/° C. between 0° C. and 250° C. is suited as a mold for use in the nanoimprint lithography capable of transferring a fine size pattern because the glass mold undergoes a minimized deformation upon temperature changes during the pattern transfer and that when the glass has a CTE distribution of up to 100 ppb/° C. at 25° C., it becomes possible both in the photo and thermal nanoimprint lithography processes to transfer a fine pattern at a high location accuracy.

Specifically, the invention provides a titania-doped quartz glass for use as nanoimprint molds, having a coefficient of linear thermal expansion (CTE) in the range of −300 to 300 ppb/° C. between 0° C. and 250° C. and a CTE distribution of up to 100 ppb/° C. at 25° C.

In preferred embodiments, the titania-doped quartz glass meets at least one of the following parameters: a titania concentration of 5 to 12% by weight; a titania concentration distribution of up to 3% by weight; a fictive temperature of up to 1200° C.; a chlorine concentration of up to 500 ppm; and an OH group concentration of up to 1000 ppm. Also preferably, the titania-doped quartz glass is free of inclusions and/or contains fluorine.

BENEFITS OF THE INVENTION

The titania-doped quartz glass prevents the mold from substantial deformation upon temperature changes during fine size pattern transfer. It becomes possible to transfer a fine pattern at a high location accuracy by the nanoimprint lithography.

DESCRIPTION OF THE PREFERRED EMBODIMENTS

Figure 1:
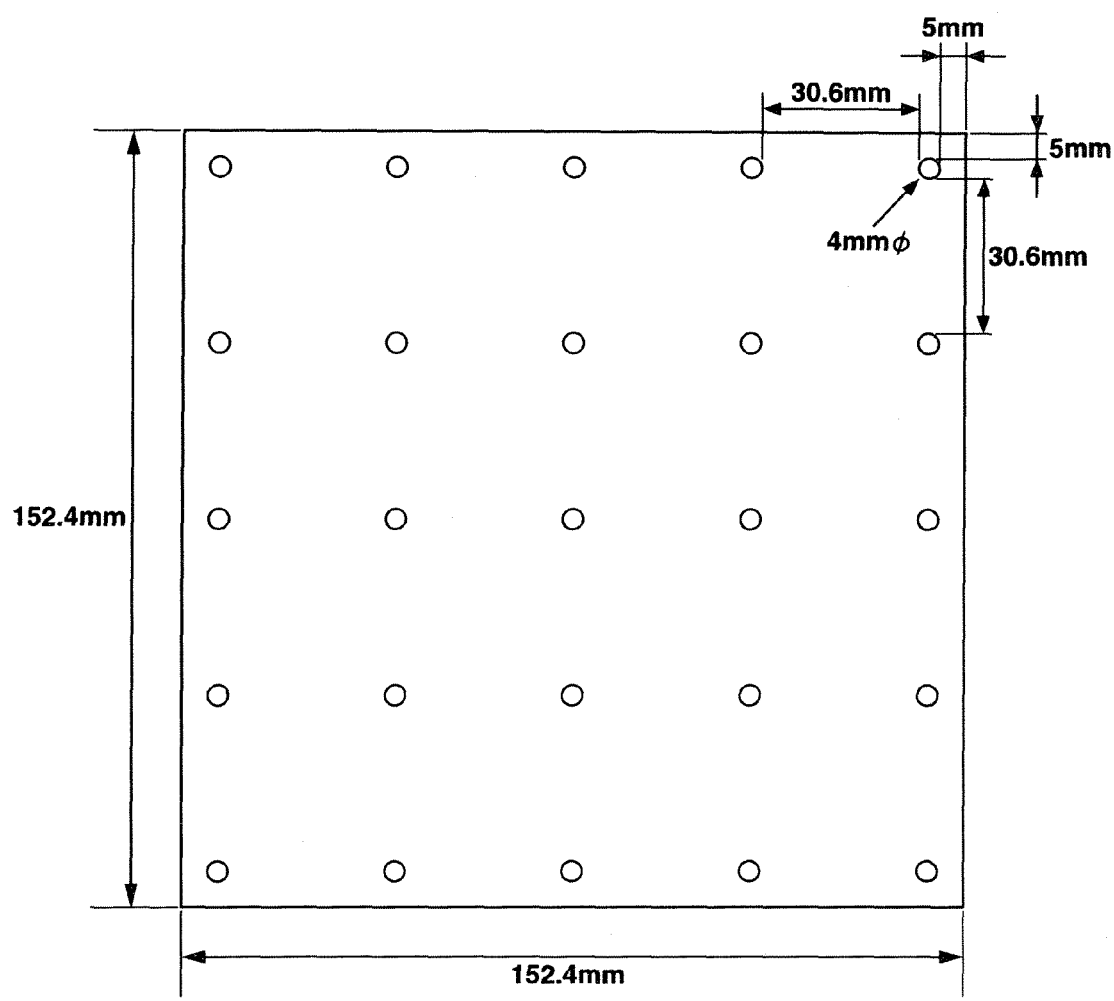
FIG. 1 is a plan view of one surface of a quartz glass ingot, showing a set of samples subject to CTE measurement.

The titania-doped quartz glass in one embodiment of the invention has a coefficient of linear thermal expansion (CTE) in the range of −300 to 300 ppb/° C. between 0° C. and 250° C., and a CTE distribution of up to 100 ppb/° C. at 25° C. The titania-doped quartz glass is suited to form a nanoimprint mold which enables to transfer a fine pattern at a high location accuracy by the nanoimprint lithography. In a preferred embodiment, the titania-doped quartz glass has a CTE in the range of −200 to 200 ppb/° C. between 0° C. and 250° C., and more preferably in the range of −100 to 100 ppb/° C. between 0° C. and 250° C. Most preferably, the glass has a CTE in the above-defined range between 20° C. and 200° C. If the CTE is outside the range, stable nanoimprint performance is not expectable due to thermal expansion.

The CTE distribution at 25° C. is up to 100 ppb/° C., preferably up to 75 ppb/° C., and more preferably up to 50 ppb/° C. If the CTE distribution is more than the limit, stable nanoimprint performance is not expectable due to a noticeable thermal expansion within the mold. While the lower limit of CTE distribution is not particularly limited, it is generally at least 0.5 ppb/° C., and preferably at least 1 ppb/° C.

In a preferred embodiment, the titania-doped quartz glass contains 5% to 12% by weight of titania. A titania concentration of 5% to 12% by weight ensures that the glass has a CTE of −300 to 300 ppb/° C. between 0° C. and 250° C. A titania concentration of 6 to 10% by weight is more preferred.

In another preferred embodiment, the titania concentration in the mold is uniform. If the titania concentration distribution is more than 3% by weight, it is sometimes not expectable to control the CTE distribution at 25° C. within 100 ppb/° C. More preferably, the titania concentration distribution is up to 1.5% by weight, and even more preferably up to 0.5% by weight. While the lower limit of titania concentration distribution is not particularly limited, the lower limit is ideally 0% by weight. The titania concentration distribution is generally at least 0.01% by weight because it is practically difficult to reduce the distribution to 0%.

If inclusions are present within the mold for photo nanoimprint lithography, they can interfere with proper nanoimprinting. This is because UV radiation for resin reaction will be absorbed or scattered by the inclusions. Then the titania-doped quartz glass of the invention should desirably be free of inclusions. As used herein, the term "inclusions" generally refers to foreign ingredients including bubbles, $TiO_2$ crystal phase, and $SiO_2$ crystal phase other than the titania-containing quartz glass phase.

In a further preferred embodiment, the titania-doped quartz glass contains at least 0.1% by weight of fluorine. Inclusion of fluorine ensures that the titania-doped quartz glass is of low expansion over a wider temperature range, which is desired for thermal nanoimprint molds. More preferably the fluorine concentration is at least 0.25% by weight, and even more preferably at least 0.5% by weight. Also advantageously fluorine doping facilitates separation of the resin from the mold. While the upper limit of fluorine concentration is not particularly limited, it is preferably up to 5% by weight and more preferably up to 3% by weight.

In a further preferred embodiment, the titania-doped quartz glass has a fictive temperature of up to 1200° C., which ensures that the titania-doped quartz glass is of low expansion over a wider temperature range. More preferably, the fictive temperature is up to 1150° C., and even more preferably up to 1100° C. While the lower limit of fictive temperature is not particularly limited, it is generally at last 500° C. and preferably at least 600° C. If the fictive temperature is above the range, only fluorine doping may be insufficient to reduce thermal expansion in the selected temperature range.

In the synthesis of titania-doped quartz glass, chlorine-containing compounds are often used as the source material. In this case, chlorine is left in the titania-doped quartz glass synthesized therefrom. Since chlorine has absorption near 325 nm, the presence of chlorine is problematic to the photo nanoimprint lithography using a light source of the near UV region such as a low-pressure mercury lamp as the light source for curing the resin against which the mold is being pressed. Once near UV light is absorbed in the mold by way of chlorine, it is converted to heat, causing a temperature increase to the mold. For this reason, the titania-doped quartz glass for mold use should desirably contain less chlorine. In a further preferred embodiment, the titania-doped quartz glass has a chlorine concentration of up to 500 ppm, and more preferably up to 250 ppm. While the lower limit of chlorine concentration is not particularly limited, it is at or below the detection limit (10 ppm) of the standard analysis, x-ray fluorescence spectroscopy.

In a further preferred embodiment, the titania-doped quartz glass has an OH concentration of up to 1000 ppm, and more preferably up to 700 ppm. This is because the resin can be more readily separated from the mold as the OH concentration of quartz glass is reduced. While the lower limit of OH concentration is not particularly limited, it is generally at least 1 ppm, and preferably at least 5 ppm.

Various properties of titania-doped quartz glass are measured by the following methods.

The CTE of mold material is measured by a precision expansion meter of NETZSCH GmbH using a cylindrical sample having a diameter of 4.0 mm and a length of 25 mm. A mold made of the mold material has an equivalent CTE.

The titania and fluorine concentrations in quartz glass can be measured by electron probe micro-analysis (EPMA).

The fictive temperature of quartz glass can be measured by an IR spectrophotometer according to the method described in Journal of Non-Crystalline Solids, 185 (1995), 191, by plotting a peak near 2260 $cm^{-1}$ on the calibration curve.

The chlorine concentration can be measured by x-ray fluorescence spectroscopy.

The OH concentration can be measured by an IR spectrophotometer. More particularly, an absorption coefficient at wave-number 4522 $cm^{-1}$ is measured by a Fourier transform IR spectrophotometer, from which the OH concentration is computed according to the equation:

OH concentration (ppm)=[(absorption coefficient at 4522 $cm^{-1}$)/$T$]×4400 wherein T is a thickness (cm) of a sample under test.

The method of preparing titania-doped quartz glass is not particularly limited as long as the resulting quartz glass meets the requirements mentioned above. Exemplary methods which can be used herein include the flame hydrolysis method capable of forming titania-doped quartz glass directly by subjecting source materials such as silicon tetrachloride or trichloromethylsilane and titanium tetrachloride to hydrolysis in an oxyhydrogen flame, the soot method (as typified by vapor-phase axial deposition (VAD) method) including preparing a titania-doped porous silica body through hydrolysis of source materials in an oxyhydrogen flame, followed by vitrification, and the plasma torch method (or Verneuil's method) including oxidizing source material gases through a plasma torch.

To control the titania concentration distribution of titania-doped quartz glass, a source gas for $SiO_2$ and a source gas for $TiO_2$ may be mixed together and injected through a common burner nozzle. It is preferred to select a material which is non-reactive with the $SiO_2$ and $TiO_2$ source gases. Where titania-doped quartz glass is prepared by injecting the source gases through separate burner nozzles, it is difficult to reduce the titania concentration distribution thereof.

To prevent inclusions from being introduced into titania-doped quartz glass, the burner nozzle is designed to inject the source gases at a linear velocity of at least 50 m/sec. Particularly when the source used is titanium tetrachloride, it is so reactive that titania is likely to deposit on the tip of the burner nozzle if the linear velocity is less than 50 m/sec. If the titania deposit is scattered, such fragments can cause inclusions.

The fictive temperature can be lowered by allowing the titania-doped quartz glass to slowly cool down from 1200° C. to 500° C.

From the standpoint of reducing the chlorine concentration in titania-doped quartz glass, the soot method is preferred. However, the flame hydrolysis method is also acceptable if a compound having a minimal or nil chlorine content is used as the source material.

For producing titania-doped quartz glass with a lower OH concentration, it is advantageous to employ the soot or plasma torch method. The plasma torch method can produce titania-doped quartz glass with a lower OH concentration because it does not use an oxyhydrogen flame unlike the flame hydrolysis and soot methods. On the other hand, the OH concentration can be reduced even with the soot method as long as the conditions under which porous silica mother material is heated for vitrification are properly controlled. When titania-doped quartz glass is prepared by the flame hydrolysis process, it is recommended to limit the calorific value to 2500 kcal/hr or below at a source feed rate of 1 mol/hr with the proviso that the source materials used are compounds containing one silicon or titanium atom per molecule. If titania-doped quartz glass is prepared at a higher calorific value, the resulting glass would contain more OH groups.

EXAMPLE

Examples of the invention are given below by way of illustration and not by way of limitation.

Example 1

To a quartz burner were fed 31 m³/hr of hydrogen gas and 15 m³/hr of oxygen gas. The source materials, trichloromethylsilane and titanium tetrachloride were heated and gasified at a rate of 1000 g/hr and 100 g/hr, respectively, combined, and fed to the quartz burner. Hydrolytic reactions of trichloromethylsilane and titanium tetrachloride in oxyhydrogen flame produced $SiO_2$ and $TiO_2$ fine particles, which were deposited on a target mounted at the quartz burner tip. The target was retracted at 10 mm/hr while it was rotated at 50 rpm. There was obtained a titania-doped quartz glass boule having a diameter of 150 mm and a length of 1000 mm in the growth direction. In this process, the burner nozzle injected the source gases at a linear velocity of 80 m/sec and the hourly colorific value was 11600 kcal/mol.

The titania-doped quartz glass boule was placed in an electric furnace where it was heated at 1700° C. for 6 hours for hot working into a prism of 155 mm×155 mm. It was held at 1200° C. for 10 hours in air for annealing, and slowly cooled down to 700° C. at a rate of 5° C./hr.

After annealing and slow cooling, the titania-doped quartz glass boule was machined into a rectangular ingot "A" of 152.4 mm×152.4 mm×100 mm thick. The six surfaces of ingot "A" were mirror polished with an abrasive in the form of cerium oxide. Under a white light source of 200,000 lux, the interior of mirror polished titania-doped quartz glass was observed to find no inclusions.

Samples (4 mm diameter×25 mm thick) were cut out from each side of ingot "A" at 25 spots uniformly distributed throughout the side surface as shown in FIG. 1. The samples were measured for CTE between 0° C. and 250° C. From the measurement results of total 50 samples, maximum and minimum values of CTE between 0° C. and 250° C. are reported in Table 1 as well as maximum and minimum values of CTE at 25° C.

Figure 2:
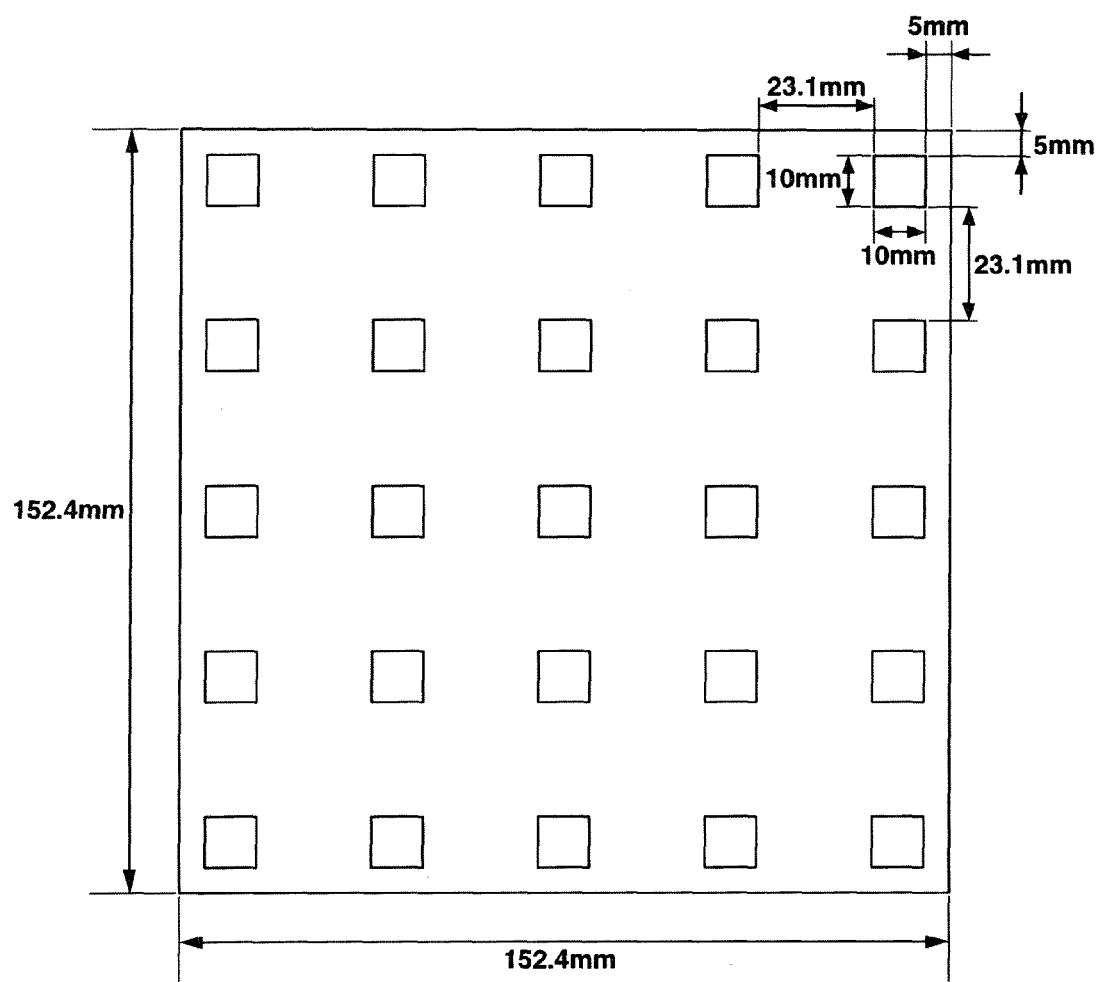
FIG. 2 is a plan view of a quartz glass plate, showing a set of zones subject to analysis.

From opposite sides of the remaining ingot "A," two plates of 152.4 mm×152.4 mm×10 mm thick were cut out. The two plates were measured for titania, fluorine, OH and chlorine concentrations and fictive temperature at 25 zones uniformly distributed throughout the plate as shown in FIG. 2. The measurement results are shown in Table 2.

It was demonstrated that the titania-doped quartz glass of this Example was satisfactory in all of CTE between 0° C. and 250° C., CTE distribution at 25° C., titania concentration, titania concentration distribution, and fictive temperature.

Example 2

To a quartz burner were fed 5.6 m³/hr of hydrogen gas and 8 m³/hr of oxygen gas. The source materials, silicon tetrachloride and titanium tetrachloride were heated and gasified at a rate of 1000 g/hr and 90 g/hr, respectively, combined, and fed to the quartz burner. Hydrolytic reactions of silicon tetrachloride and titanium tetrachloride in oxyhydrogen flame produced $SiO_2$ and $TiO_2$ fine particles, which were deposited on a target mounted at the quartz burner tip. The target was retracted at 10 mm/hr while it was rotated at 50 rpm. There was obtained a titania-doped porous silica mother material.

The titania-doped porous silica mother material was heated at 1520° C. in a mixed atmosphere of helium gas and silicon tetrafluoride gas for vitrification. There was obtained a titania-doped quartz glass having a diameter of 150 mm and a length of 1000 mm in the growth direction.

The titania-doped quartz glass was placed in an electric furnace where it was heated at 1700° C. for 6 hours for hot working into a prism of 155 mm×155 mm. It was held at 1300° C. for 10 hours in air for annealing, and slowly cooled down to 700° C. at a rate of 5° C./hr.

After annealing and slow cooling, the titania-doped quartz glass was machined into a rectangular ingot "B" of 152.4 mm×152.4 mm×100 mm thick. The six surfaces of ingot "B" were mirror polished with an abrasive in the form of cerium oxide. Under a white light source of 200,000 lux, the interior of mirror polished titania-doped quartz glass was observed to find no inclusions.

Samples (4 mm diameter×25 mm thick) were cut out from each side of ingot "B" at 25 spots as shown in FIG. 1. The samples were measured for CTE between 0° C. and 250° C. From the measurement results of total 50 samples, maximum and minimum values of CTE between 0° C. and 250° C. are reported in Table 1 as well as maximum and minimum values of CTE at 25° C.

From opposite sides of the remaining ingot "B," two plates of 152.4 mm×152.4 mm×10 mm thick were cut out. The two plates were measured for titania, fluorine, OH and chlorine concentrations and fictive temperature at 25 zones as shown in FIG. 2. The measurement results are shown in Table 2.

The titania-doped quartz glass of this Example was satisfactory in CTE distribution at 25° C., titania concentration, titania concentration distribution, and fictive temperature. Owing to the presence of fluorine, the difference between maximum and minimum values of CTE between 0° C. and 250° C. is reduced, indicating low expansion over a wider temperature range. Due to a low OH concentration, the glass can be smoothly separated from a resin material and is thus suited to form nanoimprint molds.

Comparative Example 1

To a quartz burner were fed 5.6 m$^3$/hr of hydrogen gas and 8 m$^3$/hr of oxygen gas. The source materials, silicon tetrachloride and titanium tetrachloride were heated and gasified at a rate of 1000 g/hr and 90 g/hr, respectively, and fed to separate nozzles of the quartz burner. Hydrolytic reactions of silicon tetrachloride and titanium tetrachloride in oxyhydrogen flame produced SiO$_2$ and TiO$_2$ fine particles, which were deposited on a target mounted at the quartz burner tip. The target was retracted at 10 mm/hr while it was rotated at 50 rpm. There was obtained a titania-doped porous silica mother material.

The titania-doped quartz glass of Comparative Example 1 showed undesirably large values of titania concentration distribution, CTE between 0° C. and 250° C., and CTE distribution at 25° C.

TABLE 1

|  | CTE between 0° C. and 250° C. ppb/° C. | | CTE at 25° C. ppb/° C. | | |
| --- | --- | --- | --- | --- | --- |
|  | Max | Min | Max | Min | Distribution |
| Example 1 | 180 | −5 | 20 | −2 | 22 |
| Example 2 | 81 | −4 | 14 | 0 | 14 |
| Comparative Example 1 | 395 | −351 | 307 | −272 | 579 |

TABLE 2

|  | Titania concentration, wt % | | F concentration, wt % | | Fictive temperature, ° C. | | OH concentration, ppm | | Cl concentration, ppm |
| --- | --- | --- | --- | --- | --- | --- | --- | --- | --- |
|  | Max | Min | Max | Min | Max | Min | Max | Min |  |
| Example 1 | 7.4 | 7.1 | <0.01 | <0.01 | 1090 | 1050 | 650 | 600 | 75 |
| Example 2 | 7.4 | 7.2 | 1.12 | 1.05 | 1070 | 1030 | 70 | 50 | <10 |
| Comparative Example 1 | 11.2 | 3.1 | 1.15 | 1.02 | 1080 | 1020 | 70 | 50 | <10 |

The titania-doped porous silica mother material was heated at 1520° C. in a mixed atmosphere of helium gas and silicon tetrafluoride gas for vitrification. There was obtained a titania-doped quartz glass ingot having a diameter of 150 mm and a length of 1000 mm in the growth direction.

The titania-doped quartz glass ingot was placed in an electric furnace where it was heated at 1700° C. for 6 hours for hot working into a prism of 155 mm×155 mm. It was held at 1300° C. for 10 hours in air for annealing, and slowly cooled down to 700° C. at a rate of 5° C./hr.

After annealing and slow cooling, the titania-doped quartz glass was machined into a rectangular ingot "C" of 152.4 mm×152.4 mm×100 mm thick. The six surfaces of ingot "C" were mirror polished with an abrasive in the form of cerium oxide. Under a white light source of 200,000 lux, the interior of mirror polished titania-doped quartz glass was observed to find no inclusions.

Samples (4 mm diameter×25 mm thick) were cut out from each side of ingot "C" at 25 spots as shown in FIG. 1. The samples were measured for CTE between 0° C. and 250° C. From the measurement results of total 50 samples, maximum and minimum values of CTE between 0° C. and 250° C. are reported in Table 1 as well as maximum and minimum values of CTE at 25° C.

From opposite sides of the remaining ingot "C," two plates of 152.4 mm×152.4 mm×10 mm thick were cut out. The two plates were measured for titania, fluorine, OH and chlorine concentrations and fictive temperature at 25 zones as shown in FIG. 2. The measurement results are shown in Table 2.

Japanese Patent Application No. 2007-150534 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A titania-doped quartz glass for use as nanoimprint molds, having a coefficient of linear thermal expansion (CTE) in the range of −4 to 100 ppb/° C. between 0° C. and 250° C. and a CTE distribution of up to 100 ppb/° C. at 25° C.;
   wherein CTE distribution is defined as the difference between maximum and minimum values of internal coefficient of linear thermal expansion as measured in random areas of a 10 mm thick layer of the glass.

2. The titania-doped quartz glass of claim 1, containing 5 to 12% by weight of titania.

3. The titania-doped quartz glass of claim 1, having a titania concentration distribution of up to 3% by weight;
   wherein titania concentration distribution is defined as the difference between maximum and minimum values of titania concentration as measured in random areas of a 10 mm thick layer of the glass.

4. The titania-doped quartz glass of claim 1, which is free of inclusions.

5. The titania-doped quartz glass of claim 1, containing fluorine.

6. The titania-doped quartz glass of claim 1, having a fictive temperature of up to 1200° C.

7. The titania-doped quartz glass of claim 1, having a chlorine concentration of up to 500 ppm.

8. The titania-doped quartz glass of claim 1, having an OH concentration of upto 1000 ppm.

* * * * *